(12) United States Patent
Lee et al.

(10) Patent No.: US 11,605,650 B2
(45) Date of Patent: Mar. 14, 2023

(54) NEGATIVE TRANSCONDUCTANCE DEVICE AND MULTI-VALUED INVERTER LOGIC DEVICE USING THE SAME

(71) Applicant: RESEARCH & BUSINESS FOUNDATION SUNGKYUNKWAN UNIVERSITY, Suwon-si (KR)

(72) Inventors: Sung Joo Lee, Seongnam-si (KR); Jeong Ho Cho, Seoul (KR); Jae Ho Jeon, Bucheon-si (KR); Hyeon Je Son, Suwon-si (KR); Hae Ju Choi, Suwon-si (KR); Min Je Kim, Suwon-si (KR)

(73) Assignee: Research & Business Foundation Sungkyunkwan University, Suwon-si (KR)

(*) Notice: Subject to any disclaimer, the term of this patent is extended or adjusted under 35 U.S.C. 154(b) by 170 days.

(21) Appl. No.: 17/095,259

(22) Filed: Nov. 11, 2020

(65) Prior Publication Data
US 2021/0143188 A1 May 13, 2021

(30) Foreign Application Priority Data
Nov. 11, 2019 (KR) .................. 10-2019-0143104

(51) Int. Cl.
*H01L 27/12* (2006.01)
*H01L 27/28* (2006.01)

(52) U.S. Cl.
CPC ...... *H01L 27/1225* (2013.01); *H01L 27/1251* (2013.01); *H01L 27/286* (2013.01)

(58) Field of Classification Search
CPC ............ H01L 27/1225; H01L 27/1251; H01L 27/286; H01L 27/0924; H01L 27/0928; H01L 27/26; H01L 47/005; H01L 29/78681
See application file for complete search history.

(56) References Cited

U.S. PATENT DOCUMENTS

2008/0312088 A1* 12/2008 Chung .................. H01L 29/16
257/29
2015/0137075 A1* 5/2015 Heo .................. H01L 29/66045
257/29

FOREIGN PATENT DOCUMENTS

KR 10-2019-0116637 A 10/2019
KR 102347691 B1 * 1/2022 ....... H01L 29/78681

OTHER PUBLICATIONS

Enxiu Wu et al., "Photoinduced Doping to Enable Tunable and High-Performance Anti-Ambipolar MoTe2/MoS2 Heterotransistors", ACS Nano, Apr. 11, 2019, pp. 5430-5438 (10 pages in English).

* cited by examiner

*Primary Examiner* — Nilufa Rahim
(74) *Attorney, Agent, or Firm* — NSIP Law

(57) ABSTRACT

A negative transconductance device is disclosed. The negative transconductance device includes a first transistor having a P-type semiconductor channel, a second transistor having an N-type semiconductor channel, and a third transistor having an ambipolar semiconductor channel and positioned between the first and second transistors. A first drain electrode of the first transistor is electrically connected to a third source electrode of the third transistor, and a drain electrode of the third transistor is electrically connected to a second source electrode of the second transistor.

14 Claims, 12 Drawing Sheets

[FIG. 1]
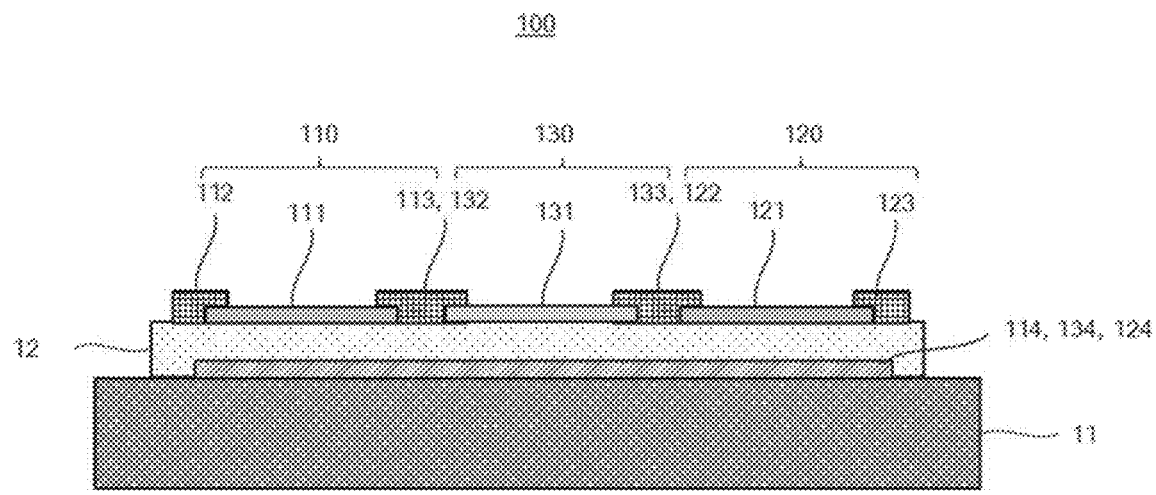
[FIG. 2]
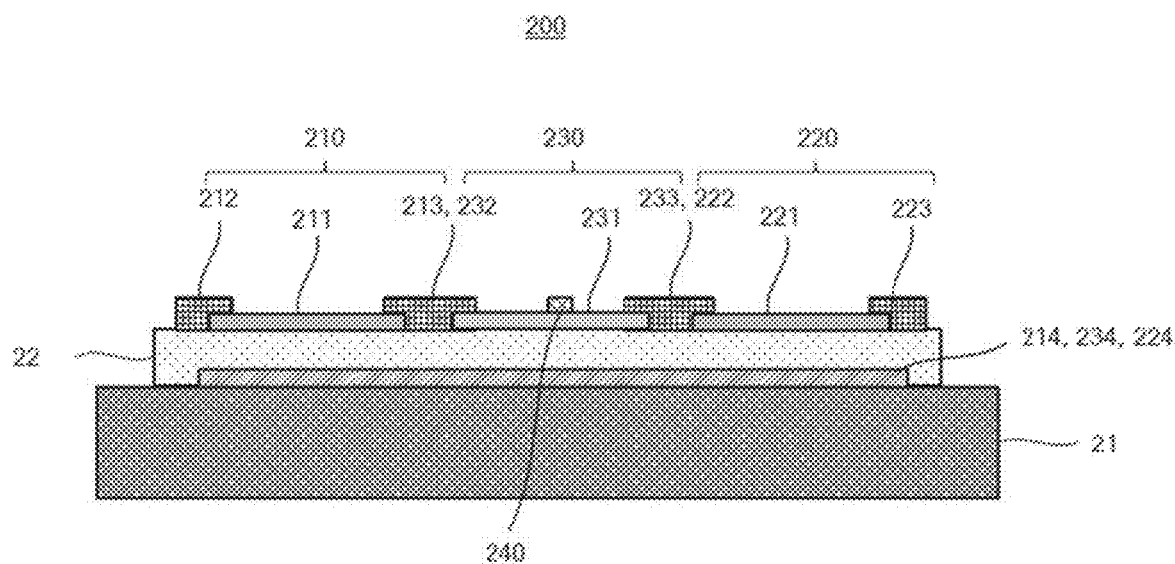

[FIG. 3]
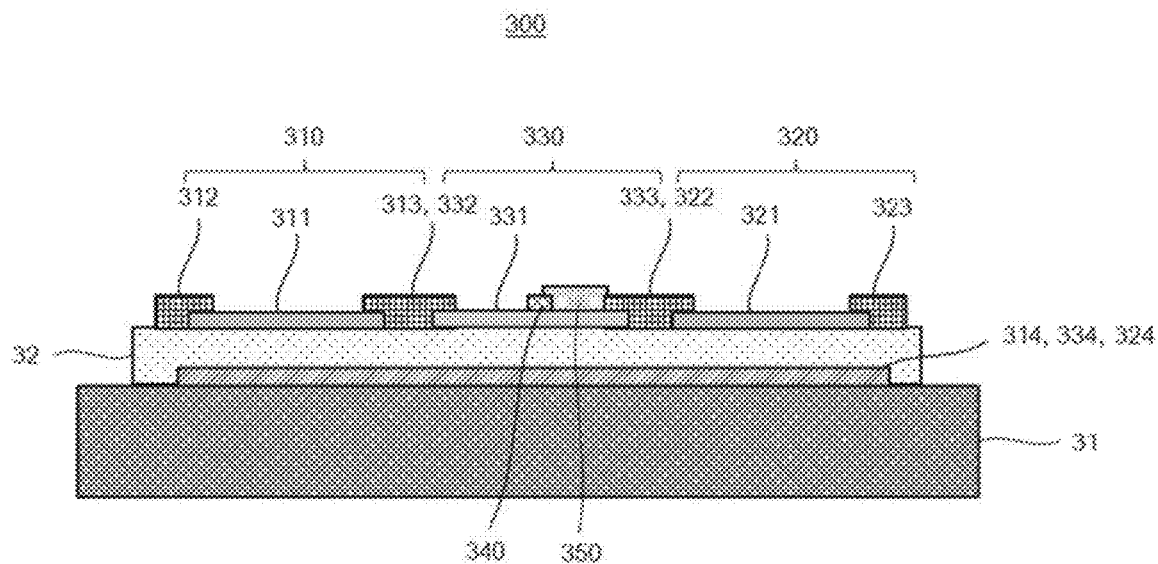
[FIG. 4]
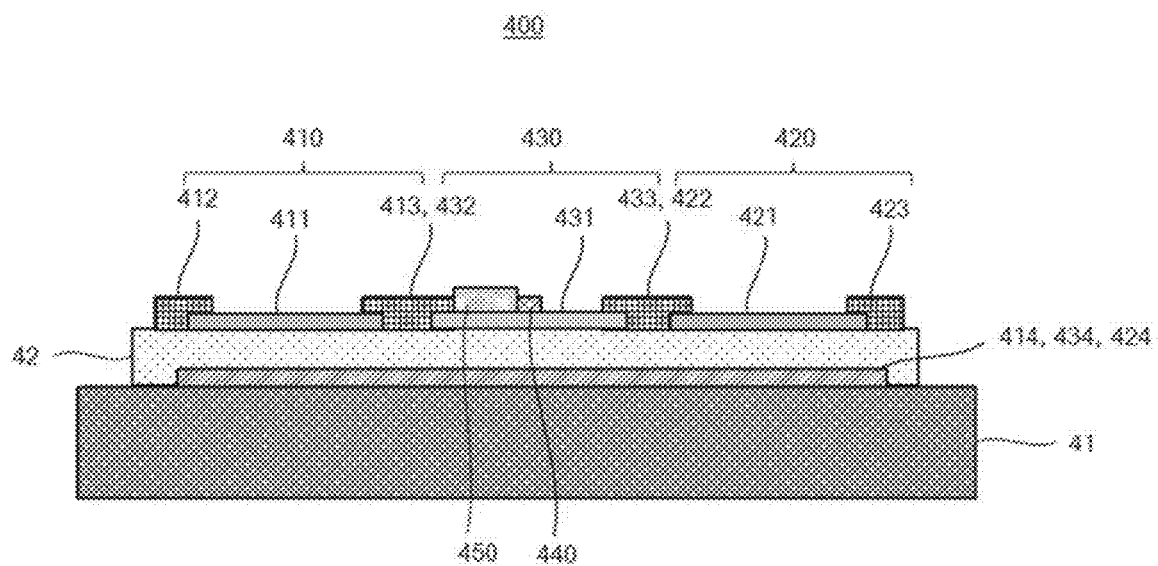

[FIG. 5]
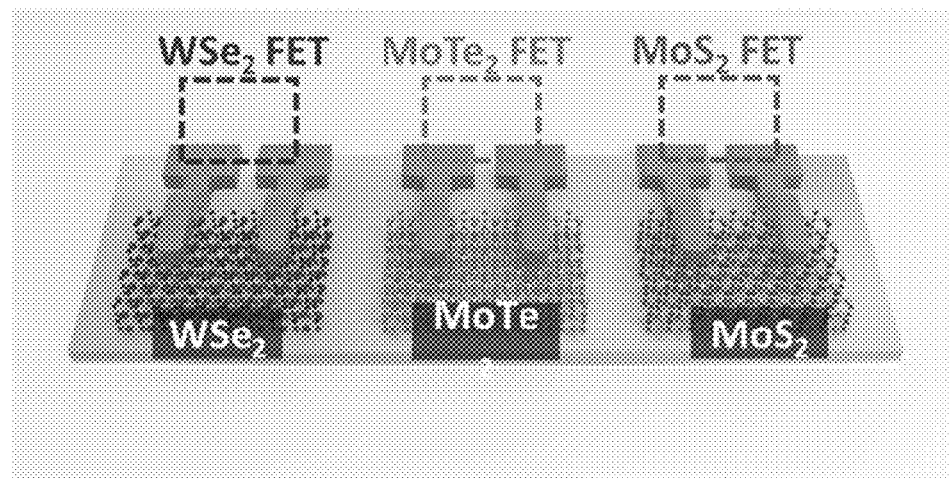
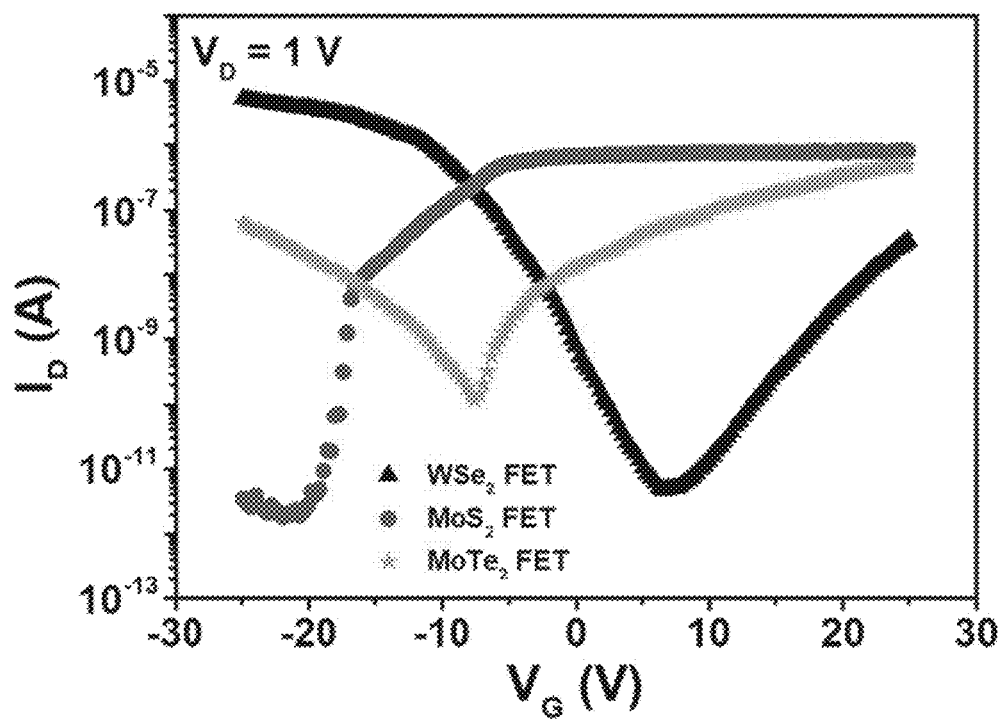

[FIG. 6A]
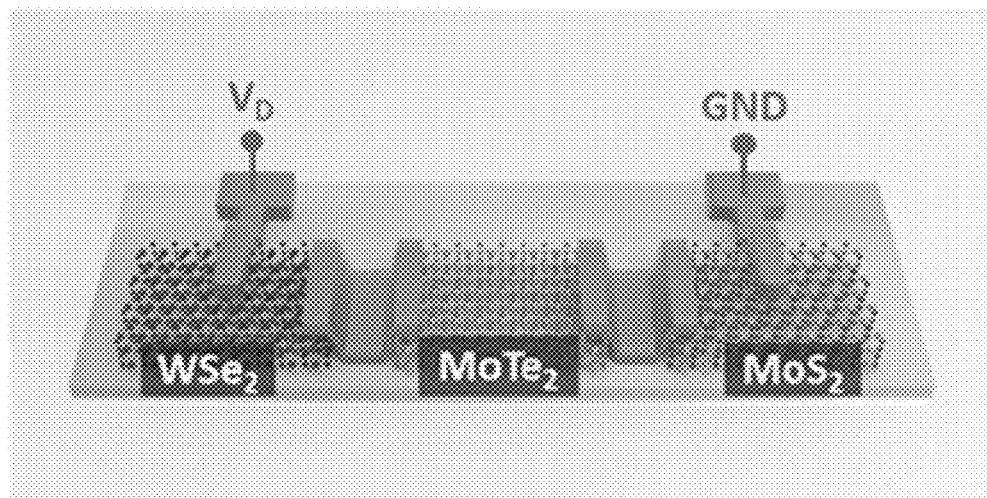
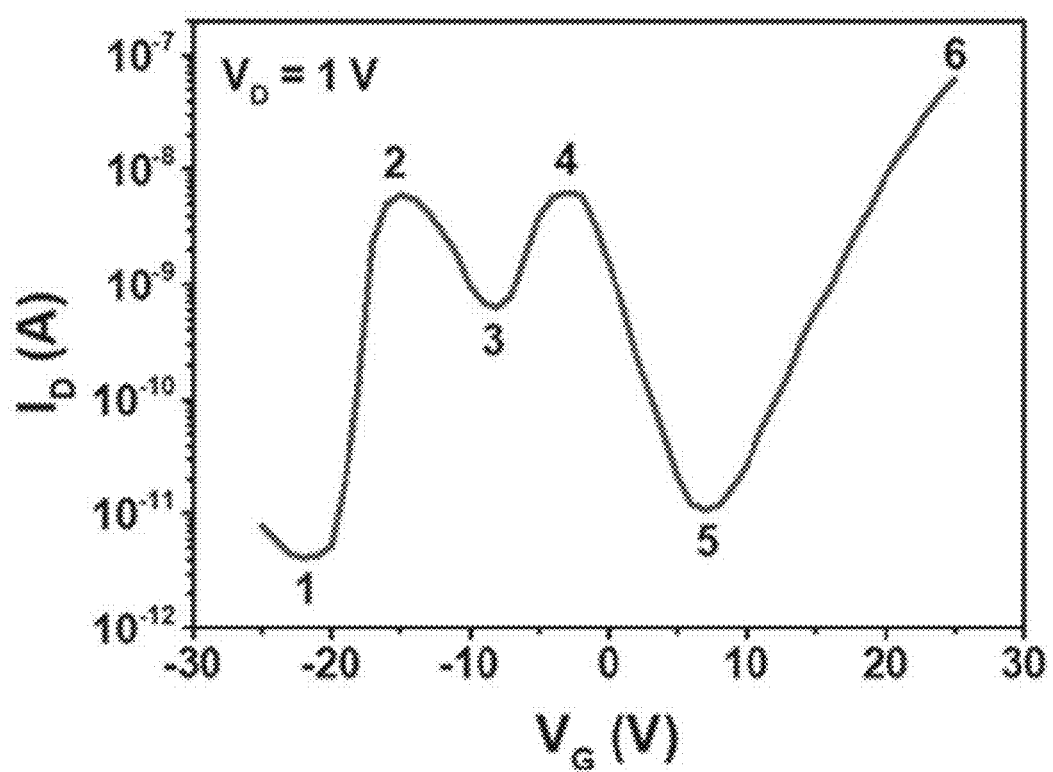

[FIG. 6B]
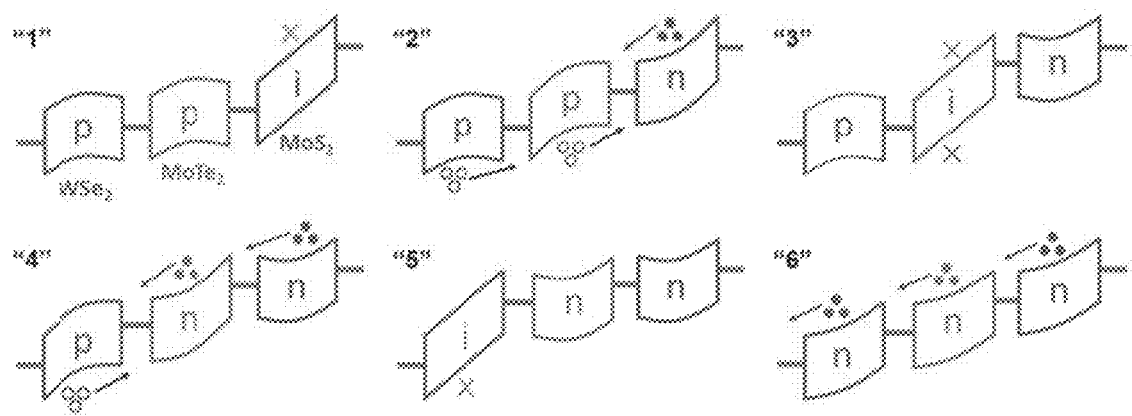

[FIG. 7A]
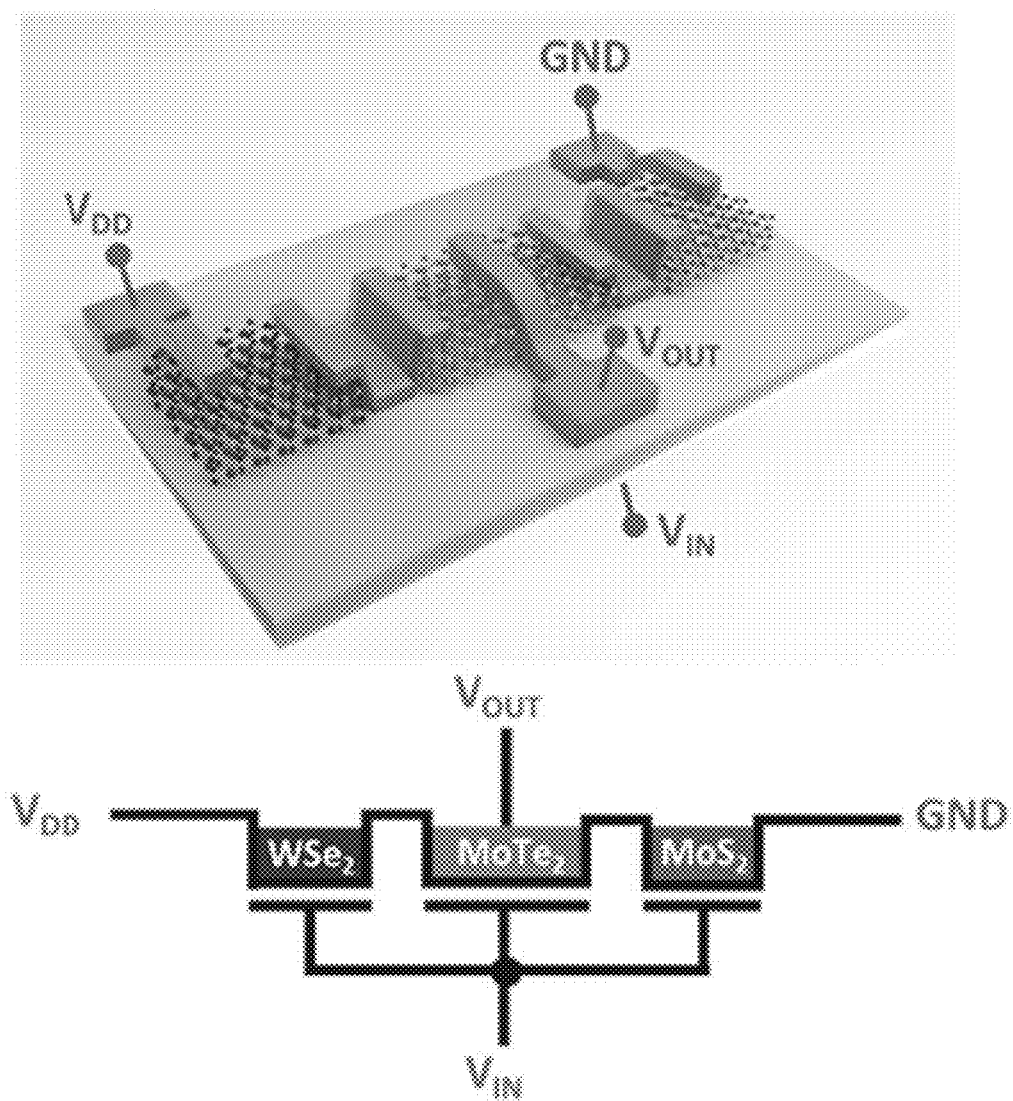

[FIG. 7B]
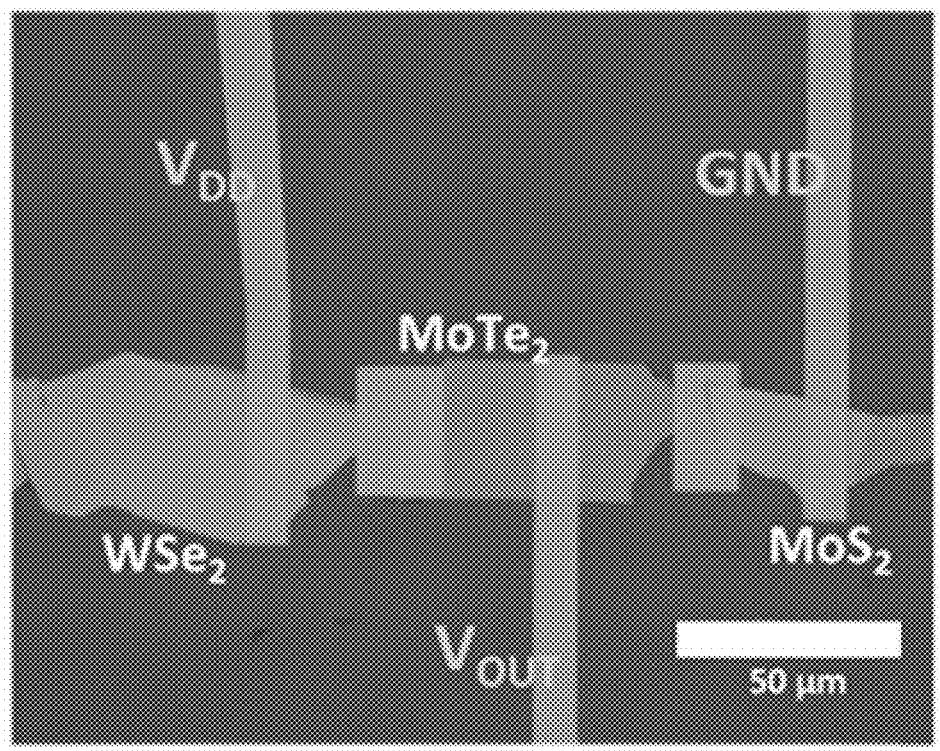

[FIG. 7C]
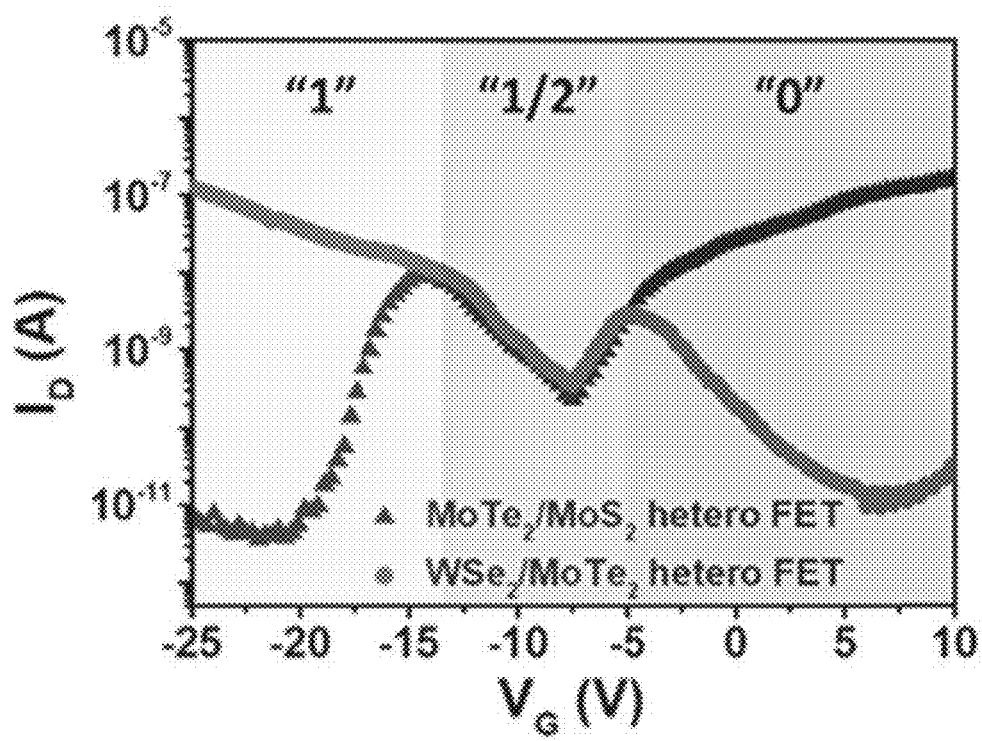
[FIG. 7D]
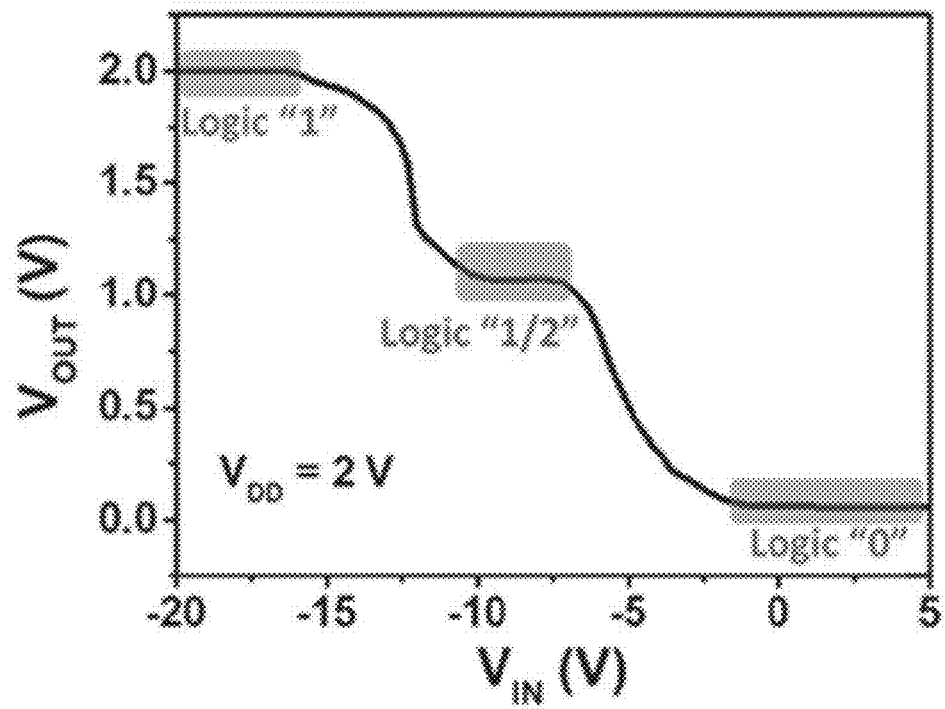

[FIG. 8A]
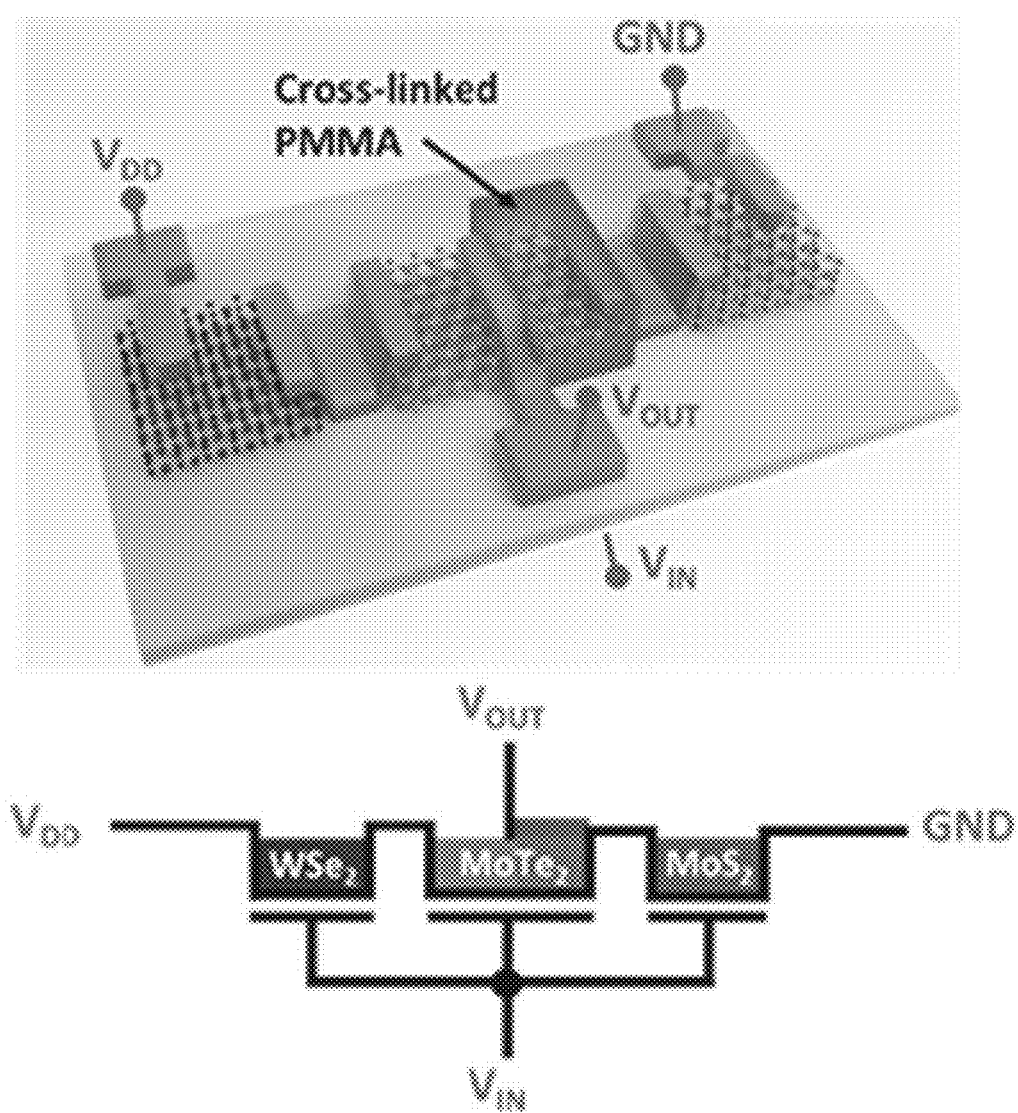

[FIG. 8B]
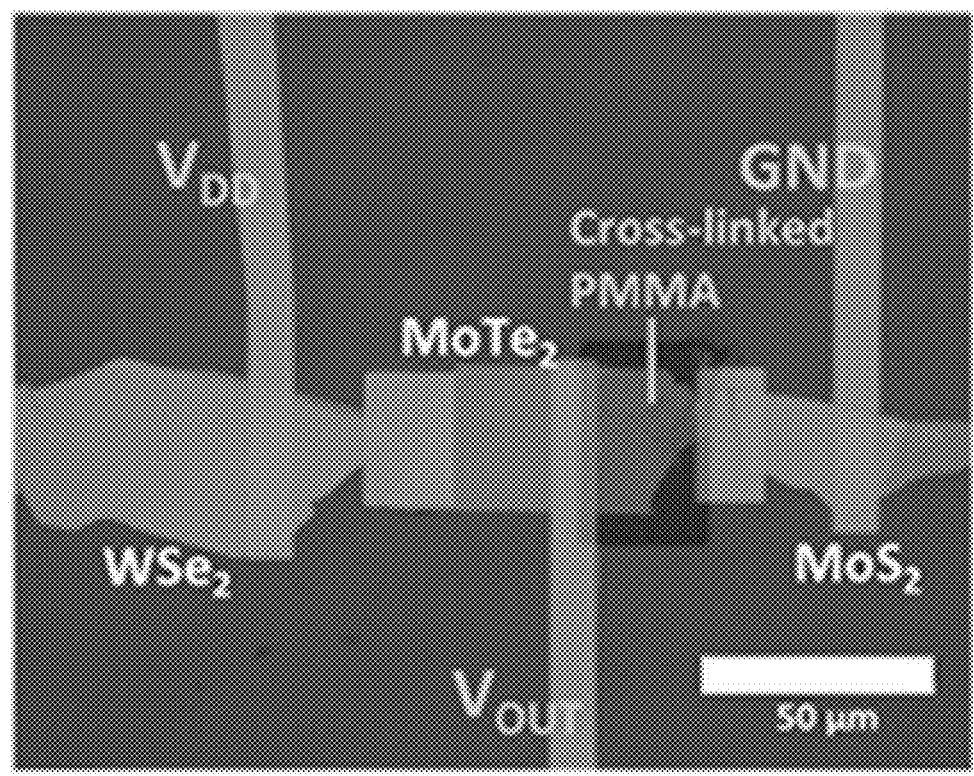

[FIG. 8C]
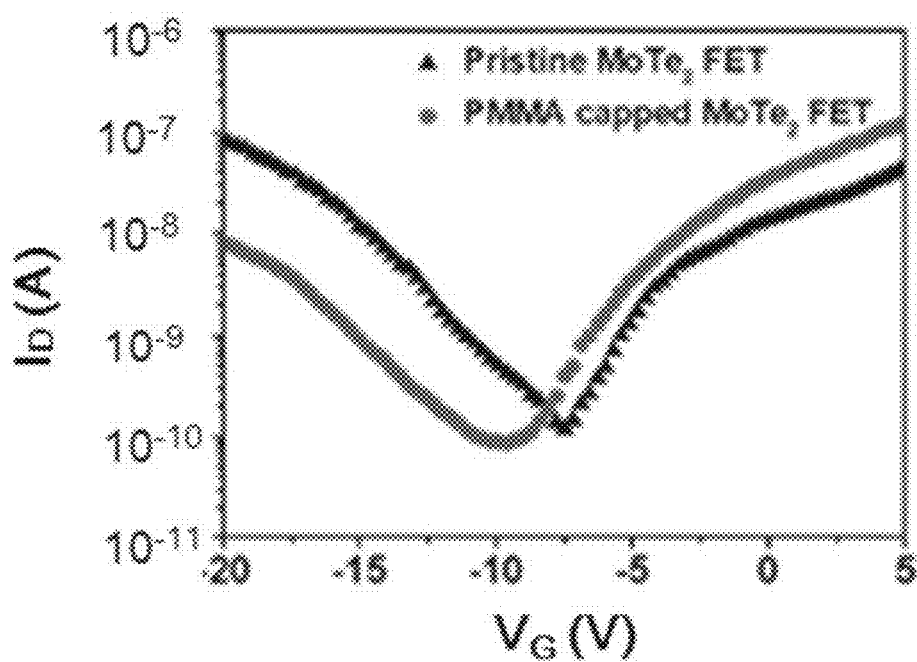
[FIG. 8D]
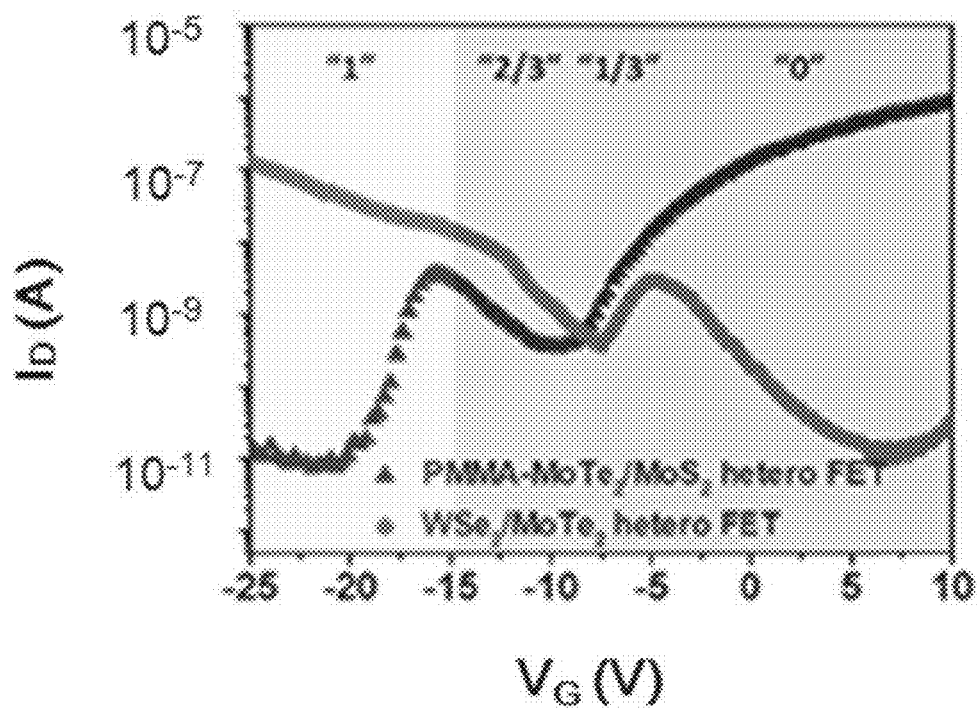

[FIG. 8E]
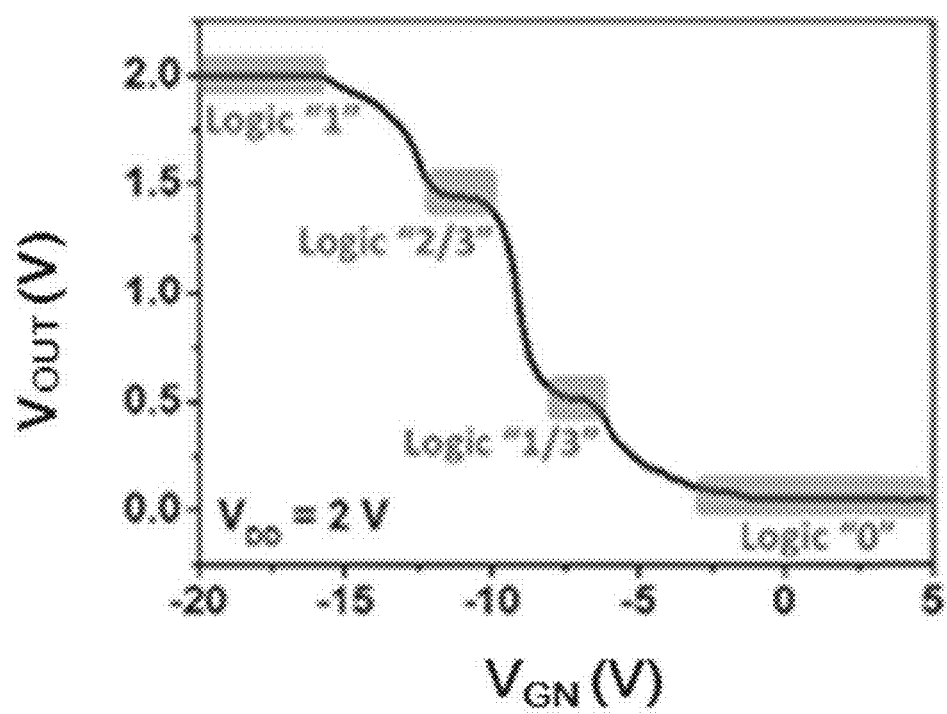

NEGATIVE TRANSCONDUCTANCE DEVICE AND MULTI-VALUED INVERTER LOGIC DEVICE USING THE SAME

CROSS-REFERENCE TO RELATED APPLICATION

This application claims a benefit under 35 U.S.C. § 119(a) of Korean Patent Application No. 10-2019-0143104 filed on Nov. 11, 2019, on the Korean Intellectual Property Office, the entire disclosure of which is incorporated herein by reference for all purposes.

BACKGROUND

1. Field

The present disclosure relates to a negative transconductance having two or more threshold voltages via a heterojunction structure of a semiconductor material, and to a multi-valued inverter logic device using the same.

2. Description of Related Art

Recently, electronic devices are being developed toward scaling down and high integration. However, when the scaling down and integration are improved via a binary device, there is a limitation in that power consumption increases and signal delay occurs due to need for many devices.

In order to overcome the limitations of such a binary device, many developments of a multi-valued device having multiple logical states in a single device are being conducted. In applying such a multi-valued device, the number of devices required for integration may be reduced, thereby solving the problem of the excessive power consumption and the signal delay.

However, in implementing the multi-value device using a conventional CMOS device, at least six transistors are required to implement the simplest multi-value device, that is, a ternary inverter, thereby causing inefficiency of circuit configuration due to complex interconnection lines.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide a negative transconductance device having two or more threshold voltages via a heterojunction structure of a semiconductor material.

Another purpose of the present disclosure is to provide a multi-valued inverter logic device using the negative transconductance device.

Purposes of the present disclosure are not limited to the above-mentioned purpose. Other purposes and advantages of the present disclosure as not mentioned above may be understood from following descriptions and more clearly understood from embodiments of the present disclosure. Further, it will be readily appreciated that the purposes and advantages of the present disclosure may be realized by features and combinations thereof as disclosed in the claims.

A first aspect of the present disclosure may be a negative transconductance device comprising: a first transistor including a P-type semiconductor channel, a first source electrode and a first drain electrode connected to the P-type semiconductor channel and spaced apart from each other, and a first gate electrode applying a gate voltage to the P-type semiconductor channel; a second transistor including an N-type semiconductor channel, a second source electrode and a second drain electrode connected to the N-type semiconductor channel and spaced apart from each other, and a second gate electrode applying a gate voltage to the N-type semiconductor channel; and a third transistor disposed between the first transistor and the second transistor, wherein the third transistor includes an ambipolar semiconductor channel, a third source electrode and a third drain electrode connected to the ambipolar semiconductor channel and spaced apart from each other, and a third gate electrode applying a gate voltage to the ambipolar semiconductor channel, wherein the first drain electrode is electrically connected to the third source electrode, wherein the third drain electrode is electrically connected to the second source electrode, wherein the first to third gate electrodes are electrically connected to each other.

In one implementation of the first aspect, the P-type semiconductor channel is made of tungsten selenide ($WSe_2$), black phosphorus (BP) or rhenium selenide ($ReSe_2$), wherein the N-type semiconductor channel is made of molybdenum sulfide ($MoS_2$), rhenium sulfide ($ReS_2$) or molybdenum selenide ($MoSe_2$), wherein the ambipolar semiconductor channel is made of molybdenum telluride ($MoTe_2$) or tungsten sulfide ($WS_2$).

In one implementation of the first aspect, the first to third gate electrodes are formed into a single integral electrode having three regions respectively overlapping the P-type semiconductor channel, the N-type semiconductor channel, and the ambipolar semiconductor channel.

In one implementation of the first aspect, the negative transconductance device further comprises a semiconductor substrate, wherein an insulating film is formed on a surface of the substrate, wherein the semiconductor substrate supports the first to third transistors thereon and functions as the first to third gate electrodes.

In one implementation of the first aspect, the first drain electrode and the third source electrode are formed into an integral single electrode, wherein the third drain electrode and the second source electrode is formed into an integral single electrode.

A second aspect of the present disclosure may be a multi-valued inverter logic device comprising: a first transistor including a P-type semiconductor channel, a first source electrode and a first drain electrode connected to the P-type semiconductor channel and spaced apart from each other, and a first gate electrode applying a gate voltage to the P-type semiconductor channel; a second transistor including an N-type semiconductor channel, a second source electrode and a second drain electrode connected to the N-type semiconductor channel and spaced apart from each other, and a second gate electrode applying a gate voltage to the N-type semiconductor channel; a third transistor disposed between the first transistor and the second transistor, wherein the third transistor includes an ambipolar semiconductor channel, a third source electrode and a third drain electrode connected to the ambipolar semiconductor channel and spaced apart from each other, and a third gate electrode applying a gate voltage to the ambipolar semiconductor channel; and an output electrode in contact with a region of the ambipolar semiconductor channel positioned between the third source electrode and the third drain electrode, wherein the first drain electrode is electrically connected to the third source electrode, wherein the third drain electrode is electrically connected to the second source electrode, wherein the first to third gate electrodes are electrically connected to each other.

In one implementation of the second aspect, the P-type semiconductor channel is made of tungsten selenide ($WSe_2$), black phosphorus (BP) or rhenium selenide ($ReSe_2$), wherein the N-type semiconductor channel is made of molybdenum sulfide ($MoS_2$), rhenium sulfide ($ReS_2$) or molybdenum selenide ($MoSe_2$), wherein the ambipolar semiconductor channel is made of molybdenum telluride ($MoTe_2$) or tungsten sulfide ($WS_2$).

In one implementation of the second aspect, the first to third gate electrodes are formed into a single integral electrode having three regions respectively overlapping the P-type semiconductor channel, the N-type semiconductor channel, and the ambipolar semiconductor channel.

In one implementation of the second aspect, the multi-valued inverter logic device further comprises a semiconductor substrate, wherein an insulating film is formed on a surface of the substrate, wherein the semiconductor substrate supports the first to third transistors thereon and functions as the first to third gate electrodes.

In one implementation of the second aspect, the first drain electrode and the third source electrode are formed into an integral single electrode, wherein the third drain electrode and the second source electrode is formed into an integral single electrode.

A third aspect of the present disclosure may be a multi-valued inverter logic device comprising: a first transistor including a P-type semiconductor channel, a first source electrode and a first drain electrode connected to the P-type semiconductor channel and spaced apart from each other, and a first gate electrode applying a gate voltage to the P-type semiconductor channel; a second transistor including an N-type semiconductor channel, a second source electrode and a second drain electrode connected to the N-type semiconductor channel and spaced apart from each other, and a second gate electrode applying a gate voltage to the N-type semiconductor channel; a third transistor disposed between the first transistor and the second transistor, wherein the third transistor includes an ambipolar semiconductor channel, a third source electrode and a third drain electrode connected to the ambipolar semiconductor channel and spaced apart from each other, and a third gate electrode applying a gate voltage to the ambipolar semiconductor channel; an output electrode in contact with a region of the ambipolar semiconductor channel positioned between the third source electrode and the third drain electrode; and an electron donating coated layer disposed on a first region of a top face of the ambipolar semiconductor channel, the first region being adjacent to the N-type semiconductor channel, wherein the first drain electrode is electrically connected to the third source electrode, wherein the third drain electrode is electrically connected to the second source electrode, wherein the first to third gate electrodes are electrically connected to each other.

In one implementation of the third aspect, the output electrode extends on the top face of the ambipolar semiconductor channel and thus divides the top face of the ambipolar semiconductor channel into the first region adjacent to the N-type semiconductor channel and a second region adjacent to the P-type semiconductor channel.

In one implementation of the third aspect, the electron donating coated layer is made of crosslinked PMMA (polymethyl methacrylate), aluminum oxide ($Al_2O_3$) or magnesium oxide (MgO).

In one implementation of the third aspect, the P-type semiconductor channel is made of tungsten selenide ($WSe_2$), black phosphorus (BP) or rhenium selenide ($ReSe_2$), wherein the N-type semiconductor channel is made of molybdenum sulfide ($MoS_2$), rhenium sulfide ($ReS_2$) or molybdenum selenide ($MoSe_2$), wherein the ambipolar semiconductor channel is made of molybdenum telluride ($MoTe_2$) or tungsten sulfide ($WS_2$).

In one implementation of the third aspect, the first to third gate electrodes are formed into a single integral electrode having three regions respectively overlapping the P-type semiconductor channel, the N-type semiconductor channel, and the ambipolar semiconductor channel.

In one implementation of the third aspect, the multi-valued inverter logic device further comprises a semiconductor substrate, wherein an insulating film is formed on a surface of the substrate, wherein the semiconductor substrate supports the first to third transistors thereon and functions as the first to third gate electrodes.

In one implementation of the third aspect, the first drain electrode and the third source electrode are formed into an integral single electrode, wherein the third drain electrode and the second source electrode is formed into an integral single electrode.

Effects in accordance with the present disclosure may be as follows but may not be limited thereto.

According to the negative transconductance device and the inverter logic device according to the present disclosure, a simple configuration using 3 transistors may realize at least three stable logic states based on a resistance ratio of 2 heterojunction transistors.

In addition to the effects as described above, specific effects in accordance with the present disclosure will be described together with the detailed description for carrying out the disclosure.

BRIEF DESCRIPTIONS OF DRAWINGS

FIG. 1 is a diagram for describing a negative transconductance device according to an embodiment of the present disclosure.

FIG. 2 is a diagram for describing a multi-valued inverter logic device according to an embodiment of the present disclosure.

FIG. 3 is a diagram for describing a multi-valued inverter logic device according to another embodiment of the present disclosure.

FIG. 4 is a diagram for describing a multi-valued inverter logic device according to still another embodiment of the present disclosure.

FIG. 5 shows a graph measuring change in a drain current $I_D$ based on a gage voltage $V_G$ in each of first to third transistors having a $WSe_2$ channel (P-type semiconductor channel), a $MoTe_2$ channel (ambipolar semiconductor channel), and a $MoS_2$ channel (N-type semiconductor channel), respectively.

FIG. 6A is a graph measuring change in a drain current $I_D$ based on a gage voltage $V_G$ in a negative transconductance device obtained by connecting the first to third transistors in series to each other, and FIG. 6B is a diagram showing a band structure of a heterojunction transistor in states of '1', '2', '3', '4', '5' and '6' as shown in FIG. 6A.

FIG. 7A is a schematic and circuit diagram of an inverter logic device in which a WSe$_2$/MoTe$_2$ heterojunction transistor and a MoTe$_2$/MoS$_2$ heterojunction transistor are connected to each other in series; FIG. 7B is an optical image of an actually manufactured inverter device; FIG. 7C is a graph showing transfer characteristics (I$_D$-V$_G$) of the WSe$_2$/MoTe$_2$ heterojunction transistor and the MoTe$_2$/MoS$_2$ heterojunction transistor; and FIG. 7D is a graph showing a V$_{OUT}$-V$_{IN}$ curve of a ternary inverter logic device.

FIG. 8A is a schematic and circuit diagram of an inverter logic device in which a WSe2/MoTe2 heterojunction transistor and a PMMA-MoTe$_2$/MoS$_2$ heterojunction transistor are connected to each other in series; FIG. 8B is an optical image of an actually manufactured inverter device; FIG. 8C is a graph showing transfer characteristics (I$_D$-V$_G$) of a MoTe$_2$ single transistor before and after local surface charge transfer doping via PMMA coating; FIG. 8D is a graph showing transfer characteristics (I$_D$-V$_G$) of a WSe$_2$/MoTe$_2$ heterojunction transistor and a PMMA-MoTe$_2$/MoS$_2$ heterojunction transistor; and FIG. 8E is a graph showing a V$_{OUT}$-V$_{IN}$ curve of the inverter logic device.

DETAILED DESCRIPTIONS

For simplicity and clarity of illustration, elements in the figures are not necessarily drawn to scale. The same reference numbers in different figures represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram for describing a negative transconductance device according to an embodiment of the present disclosure.

Referring to FIG. 1, a negative transconductance device 100 according to an embodiment of the present disclosure may include a first transistor 110, a second transistor 120, and a third transistor 130.

The first transistor 110 includes a P-type semiconductor channel 111, a first source electrode 112 and a first drain electrode 113 connected to the P-type semiconductor channel 111 and spaced apart from each other, a first gate electrode 114 that applies a gate voltage to the P-type semiconductor channel 111. The P-type semiconductor channel 111 may be made of a 2-D semiconductor material selected from tungsten selenide (WSe$_2$), black phosphorus (BP), and rhenium selenide (ReSe$_2$) or the like.

The second transistor 120 includes an N-type semiconductor channel 121, a second source electrode 122 and a second drain electrode 123 connected to the N-type semiconductor channel 121 and spaced apart from each other, and a second gate electrode 124 that applies a gate voltage to the N-type semiconductor channel 121. The N-type semiconductor channel 121 may be made of a 2-D semiconductor material selected from molybdenum sulfide ($MoS_2$), rhenium sulfide ($ReS_2$), molybdenum selenide ($MoSe_2$), or the like.

The third transistor 130 includes an ambipolar semiconductor channel 131, a third source electrode 132 and a third drain electrode 133 connected to the ambipolar semiconductor channel 131 and spaced apart from each other, and a third gate electrode 134 for applying a gate voltage to the ambipolar semiconductor channel 131. The ambipolar semiconductor channel 131 may be made of a 2-D semiconductor material selected from molybdenum telluride ($MoTe_2$), tungsten sulfide ($WS_2$), or the like.

In one embodiment, the first to third transistors 110, 120, 130 may be disposed on the substrate 11. The first transistor 110 and the second transistor 120 may be spaced apart from each other. The third transistor 130 may be disposed between the first transistor 110 and the second transistor 120.

The first to third gate electrodes 114, 124, and 134 of the first to third transistors 110, 120, and 130 may be electrically connected to each other so that the same gate voltage may be applied to the P-type semiconductor channel 111, the N-type semiconductor channel 121 and the ambipolar semiconductor channel 131. A gate insulating layer 12 may be formed between the first to third gate electrodes 114, 124, 134 and the P-type semiconductor channel 111, the N-type semiconductor channel 121 and the ambipolar semiconductor channel 131. In one embodiment, the first to third gate electrode 114, 124, and 134 may be formed in the form of a single electrode having a region overlapping each of the P-type semiconductor channel 111, the N-type semiconductor channel 121, and the ambipolar semiconductor channel 131. In another embodiment, when the substrate 11 is a semiconductor substrate, the substrate 10 may be used as the first to third gate electrodes 114, 124, and 134.

The first source electrode 112 of the first transistor 110 may be electrically connected to an input terminal, and the first drain electrode 113 of the first transistor 110 may be electrically connected to the third source electrode 132 of the third transistor 130. In one embodiment, the first drain electrode 113 and the third source electrode 132 may be formed in a form of an integral single electrode. Further, the third drain electrode 133 of the third transistor 130 may be electrically connected to the second source electrode 122 of the second transistor 120, and the second drain electrode 123 of the second transistor 120 may be electrically connected to an output terminal. In an exemplary embodiment, the third drain electrode 133 and the second source electrode 122 may be formed in a form of an integral single electrode.

According to the negative transconductance device 100 according to the present disclosure, heterojunction between a P-type semiconductor material and an ambipolar semiconductor material and heterojunction between an ambipolar semiconductor material and an N-type semiconductor material may be provided, such that two or more threshold voltages may be provided.

FIG. 2 is a diagram for describing a multi-valued inverter logic device according to an embodiment of the present disclosure.

Referring to FIG. 2, a multi-valued inverter logic device 200 according to an embodiment of the present disclosure includes a first transistor 210, a second transistor 220, a third transistor 230, and an output electrode 240.

The first to third transistors 210, 220, and 230 are substantially the same as the first to third transistors 110, 120, and 130 of the negative transconductance device 100 as described with reference to FIG. 1, respectively. Thus, the redundant detailed description thereof is omitted. Hereinafter, descriptions will focus on differences.

The output electrode 240 may be electrically connected to an external electronic device (not shown). The output electrode 240 may contact the ambipolar semiconductor channel 231 may contact and thus may be electrically connected to the ambipolar semiconductor channel 231 and may be disposed in a region of the ambipolar semiconductor channel 231 of the third transistor 230 between the third source electrode 232 and the third drain electrode 233.

The second drain electrode 223 of the second transistor 220 may be connected to ground.

According to the multi-valued inverter logic device 200 according to the present disclosure, the ambipolar semiconductor channel is divided such that a heterojunction negative transconductance transistor of the P-type semiconductor and the ambipolar semiconductor, and a heterojunction negative transconductance transistor of the ambipolar semiconductor and N-type semiconductor are formed. Thus, a series connection circuit of the two heterojunction transistors may implement a ternary inverter logic device that operates complementarily.

FIG. 3 is a diagram for describing a multi-valued inverter logic device according to another embodiment of the present disclosure.

Referring to FIG. 3, a multi-valued inverter logic device 300 according to another embodiment of the present disclosure includes a first transistor 310, a second transistor 320, a third transistor 330, an output electrode 340, and an electron donating coated layer 350.

The first to third transistors 310, 320, and 330 and the output electrode 340 are substantially the same as the first to third transistors 210, 220 and 230, and the output electrode 240 of the multi-valued inverter logic device 200 as described with reference to FIG. 2, respectively. Thus, duplicate detailed descriptions thereof are omitted. Hereinafter, descriptions will focus on differences.

The electron donating coated layer 350 may be disposed on a first region adjacent to the N-type semiconductor channel 321 of a top face of the ambipolar semiconductor channel 331 to supply electrons to the first region of the ambipolar semiconductor channel 331. For example, the output electrode 340 extends on the top face of the ambipolar semiconductor channel 331 to divide the top face of the ambipolar semiconductor channel 331 into the first region adjacent to the N-type semiconductor channel 321 and a second region adjacent to the P-type semiconductor channel 311. The electron donating coated layer 350 may be located on the first region.

In one embodiment, the electron donating coated layer 350 may be made of a material having electron donating properties. For example, the electron donating coated layer 350 may be made of a material selected from crosslinked polymethyl methacrylate (PMMA), aluminum oxide ($Al_2O_3$), magnesium oxide (MgO), or the like.

FIG. 4 is a diagram for describing a multi-valued inverter logic device according to still another embodiment of the present disclosure.

Referring to FIG. 4, a multi-valued inverter logic device 400 according to another embodiment of the present disclosure includes a first transistor 410, a second transistor 420, a third transistor 430, an output electrode 440, and a hole donating coated layer 450.

The first to third transistors 410, 420, and 430 and the output electrode 440 are substantially the same as the first to third transistors 210, 220 and 230, and the output electrode 240 of the multi-valued inverter logic device 200 as described with reference to FIG. 2, respectively. Thus, duplicate detailed descriptions thereof are omitted. Hereinafter, descriptions will focus on differences.

The hole donating coated layer 450 may be disposed on a second region adjacent to the P-type semiconductor channel 411 of a top face of the ambipolar semiconductor channel 431 to supply holes to the second region of the ambipolar semiconductor channel 431. For example, the output electrode 440 extends on the top face of the ambipolar semiconductor channel 431 to divide the top face of the ambipolar semiconductor channel 431 into the first region adjacent to the N-type semiconductor channel 421 and a second region adjacent to the P-type semiconductor channel 411. The hole donating coated layer 450 may be located on the second region.

In one embodiment, the hole donating coated layer 450 may be made of a material having hole donating properties. For example, the hole donating coated layer 450 may be made of a material selected from MoO3, NO2, AuCl3, crosslinked polymethyl methacrylate (PMMA), aluminum oxide ($Al_2O_3$), magnesium oxide (MgO), or the like.

According to the multi-valued inverter logic device according to the present disclosure, the electrons from the electron donating coated layer may be doped into the first region of the ambipolar semiconductor channel, such that the multi-valued inverter logic device may have 4 logic states.

Hereinafter, characteristics of the negative transconductance and the multi-valued inverter logic device according to the present disclosure will be described based on the experimental results.

FIG. 5 shows a graph measuring change in a drain current $I_D$ based on a gage voltage $V_G$ in each of first to third transistors having a $WSe_2$ channel (P-type semiconductor channel), a $MoTe_2$ channel (ambipolar semiconductor channel), and a $MoS_2$ channel (N-type semiconductor channel), respectively. FIG. 6A is a graph measuring change in a drain current $I_D$ based on a gage voltage $V_G$ in a negative transconductance device obtained by connecting the first to third transistors in series to each other. FIG. 6B is a diagram showing a band structure of a heterojunction transistor in states of '1', '2', '3', '4', '5' and '6' as shown in FIG. 6A.

Referring to FIG. 5, FIG. 6A, and FIG. 6B, it may be seen that the $WSe_2$ channel (P-type semiconductor channel) has the highest threshold voltage, and the $MoS_2$ channel (N-type semiconductor channel) has the lowest threshold voltage, and the $MoTe_2$ channel (ambipolar semiconductor channel) has a threshold voltage between the threshold voltage of the $WSe_2$ channel (P-type semiconductor channel) and the threshold voltage of the $MoS_2$ channel (N-type semiconductor channel).

Thus, it may be seen that when the negative transconductance device is formed by connecting the first to third transistors to each other in series as shown in FIG. 6A, two or more threshold voltages are realized.

FIG. 7A is a schematic and circuit diagram of an inverter logic device in which a WSe2/MoTe2 heterojunction transistor and a $MoTe_2/MoS_2$ heterojunction transistor are connected to each other in series; FIG. 7B is an optical image of an actually manufactured inverter device; FIG. 7C is a graph showing transfer characteristics ($I_D$-$V_G$) of the $WSe_2$/$MoTe_2$ heterojunction transistor and the $MoTe_2$/$MoS_2$ heterojunction transistor; and FIG. 7D is a graph showing a $V_{OUT}$-$V_{IN}$ curve of a ternary inverter logic device.

Referring to FIGS. 7A to 7D, it may be seen that when the first to third transistors respectively having a $WSe_2$ channel (P-type semiconductor channel), a $MoTe_2$ channel (ambipolar semiconductor channel), and a $MoS_2$ channel (N-type semiconductor channel) are used to manufacture the inverter logic device as shown in FIG. 7A, the inverter logic device has three stable logic states based on a resistance ratio of the two heterojunction transistors based on the complementary operation of "1", "3" and "5" gate voltage regions shown in FIG. 6A.

FIG. 8A is a schematic and circuit diagram of an inverter logic device in which a WSe2/MoTe2 heterojunction transistor and a PMMA-$MoTe_2$/$MoS_2$ heterojunction transistor are connected to each other in series; FIG. 8B is an optical image of an actually manufactured inverter device; FIG. 8C is a graph showing transfer characteristics ($I_D$-$V_G$) of a $MoTe_2$ single transistor before and after local surface charge transfer doping via PMMA coating; FIG. 8D is a graph showing transfer characteristics ($I_D$-$V_G$) of a $WSe_2$/$MoTe_2$ heterojunction transistor and a PMMA-$MoTe_2$/$MoS_2$ heterojunction transistor; and FIG. 8E is a graph showing a $V_{OUT}$-$V_{IN}$ curve of the inverter logic device.

Referring to FIGS. 8A to 8E, when manufacturing the inverter logic device by coating crosslinked PMMA on a region adjacent to the $MoS_2$ channel of a surface region of the $MoTe_2$ channel as divided into two regions via an output electrode ($V_{out}$), an intermediate logic state in which the resistance ratio of the two heterojunction transistors is about 1:1 in FIG. 7C disappears after local surface charge transfer and doping and, instead, two new regions having similar transconductance thereto are created such that the four logical states are realized.

As described above, the present disclosure is described with reference to the drawings. However, the present disclosure is not limited to the embodiments and drawings disclosed in the present specification. It will be apparent that various modifications may be made thereto by those skilled in the art within the scope of the present disclosure. Furthermore, although the effect resulting from the features of the present disclosure has not been explicitly described in the description of the embodiments of the present disclosure, it is obvious that a predictable effect resulting from the features of the present disclosure should be recognized.

What is claimed is:

1. A negative transconductance device comprising:
a first transistor including a P-type semiconductor channel, a first source electrode and a first drain electrode connected to the P-type semiconductor channel and spaced apart from each other, and a first gate electrode applying a gate voltage to the P-type semiconductor channel;
a second transistor including an N-type semiconductor channel, a second source electrode and a second drain electrode connected to the N-type semiconductor channel and spaced apart from each other, and a second gate electrode applying the gate voltage to the N-type semiconductor channel; and
a third transistor disposed between the first transistor and the second transistor, wherein the third transistor includes an ambipolar semiconductor channel, a third source electrode and a third drain electrode connected to the ambipolar semiconductor channel and spaced apart from each other, and a third gate electrode applying a gate voltage to the ambipolar semiconductor channel, wherein the first drain electrode is electrically connected to the third source electrode, wherein the third drain electrode is electrically connected to the second source electrode, and wherein the first to third gate electrodes are electrically connected to each other.

2. The negative transconductance device of claim 1, wherein the P-type semiconductor channel comprises tungsten selenide ($WSe_2$), black phosphorus (BP) or rhenium selenide ($ReSe_2$), wherein the N-type semiconductor channel comprises molybdenum sulfide ($MoS_2$), rhenium sulfide ($ReS_2$) or molybdenum selenide ($MoSe_2$), wherein the ambipolar semiconductor channel comprises molybdenum telluride ($MoTe_2$) or tungsten sulfide ($WS_2$).

3. The negative transconductance device of claim 1, wherein the first to third gate electrodes are formed into a single integral electrode having three regions respectively overlapping the P-type semiconductor channel, the N-type semiconductor channel, and the ambipolar semiconductor channel.

4. The negative transconductance device of claim 1, wherein the negative transconductance device further comprises a semiconductor substrate, wherein an insulating film is formed on a surface of the substrate, and wherein the semiconductor substrate supports the first to third transistors thereon and functions as the first to third gate electrodes.

5. The negative transconductance device of claim 1, wherein the first drain electrode and the third source electrode are formed into an integral single electrode, and wherein the third drain electrode and the second source electrode are formed into an integral single electrode.

6. A multi-valued inverter logic device comprising:

a first transistor including a P-type semiconductor channel, a first source electrode and a first drain electrode connected to the P-type semiconductor channel and spaced apart from each other, and a first gate electrode applying a gate voltage to the P-type semiconductor channel;

a second transistor including an N-type semiconductor channel, a second source electrode and a second drain electrode connected to the N-type semiconductor channel and spaced apart from each other, and a second gate electrode applying the gate voltage to the N-type semiconductor channel;

a third transistor disposed between the first transistor and the second transistor, wherein the third transistor includes an ambipolar semiconductor channel, a third source electrode and a third drain electrode connected to the ambipolar semiconductor channel and spaced apart from each other, and a third gate electrode applying the gate voltage to the ambipolar semiconductor channel; and an output electrode in contact with a region of the ambipolar semiconductor channel positioned between the third source electrode and the third drain electrode, wherein the first drain electrode is electrically connected to the third source electrode, wherein the third drain electrode is electrically connected to the second source electrode, and wherein the first to third gate electrodes are electrically connected to each other.

7. The multi-valued inverter logic device of claim 6, wherein the P-type semiconductor channel comprises tungsten selenide ($WSe_2$), black phosphorus (BP) or rhenium selenide ($ReSe_2$), wherein the N-type semiconductor channel comprises molybdenum sulfide ($MoS_2$), rhenium sulfide ($ReS_2$) or molybdenum selenide ($MoSe_2$), and wherein the ambipolar semiconductor channel comprises molybdenum telluride ($MoTe_2$) or tungsten sulfide ($WS_2$).

8. The multi-valued inverter logic device of claim 6, wherein the first to third gate electrodes are formed into a single integral electrode having three regions respectively overlapping the P-type semiconductor channel, the N-type semiconductor channel, and the ambipolar semiconductor channel.

9. The multi-valued inverter logic device of claim 6, wherein the multi-valued inverter logic device further comprises a semiconductor substrate, wherein an insulating film is formed on a surface of the substrate, and wherein the semiconductor substrate supports the first to third transistors thereon and functions as the first to third gate electrodes.

10. The multi-valued inverter logic device of claim 6, wherein the first drain electrode and the third source electrode are formed into an integral single electrode, and wherein the third drain electrode and the second source electrode are formed into an integral single electrode.

11. A multi-valued inverter logic device comprising:

a first transistor including a P-type semiconductor channel, a first source electrode and a first drain electrode connected to the P-type semiconductor channel and spaced apart from each other, and a first gate electrode applying a gate voltage to the P-type semiconductor channel;

a second transistor including an N-type semiconductor channel, a second source electrode and a second drain electrode connected to the N-type semiconductor channel and spaced apart from each other, and a second gate electrode applying the gate voltage to the N-type semiconductor channel;

a third transistor disposed between the first transistor and the second transistor, wherein the third transistor includes an ambipolar semiconductor channel, a third source electrode and a third drain electrode connected to the ambipolar semiconductor channel and spaced apart from each other, and a third gate electrode applying the gate voltage to the ambipolar semiconductor channel;

an output electrode in contact with a region of the ambipolar semiconductor channel positioned between the third source electrode and the third drain electrode; and one of an electron donating coated layer disposed on a first region, which is adjacent to the N-type semiconductor channel, of a top face of the ambipolar semiconductor channel and a hole donating coated layer disposed on a second region, which is adjacent to the P-type semiconductor channel, of the top face of the ambipolar semiconductor channel, wherein the first drain electrode is electrically connected to the third source electrode, wherein the third drain electrode is electrically connected to the second source electrode, and wherein the first to third gate electrodes are electrically connected to each other.

12. The multi-valued inverter logic device of claim 11, wherein the output electrode extends on the top face of the ambipolar semiconductor channel and thus divides the top face of the ambipolar semiconductor channel into the first region adjacent to the N-type semiconductor channel and the second region adjacent to the P-type semiconductor channel.

13. The multi-valued inverter logic device of claim 11, wherein the multi-valued inverter logic device comprises the electron donating coated layer, and wherein the electron donating coated layer comprises crosslinked PMMA (polymethyl methacrylate), aluminum oxide ($Al_2O_3$) or magnesium oxide (MgO).

14. The multi-valued inverter logic device of claim 11, wherein the multi-valued inverter logic device comprises the hole donating coated layer , and wherein the hole donating coated layer comprises $MoO_3$, $NO_2$ or $AuCl_3$.

* * * * *